United States Patent
Ko et al.

(10) Patent No.: US 7,820,311 B2
(45) Date of Patent: Oct. 26, 2010

(54) FERROELECTRIC RECORDING MEDIUM AND WRITING METHOD FOR THE SAME

(75) Inventors: Hyoung-soo Ko, Seoul (KR); Eun-sik Kim, Seoul (KR); Sung-dong Kim, Seongnam-si (KR); Ju-hwan Jung, Seoul (KR); Hong-sik Park, Seoul (KR); Chul-min Park, Yongin-si (KR); Seung-bum Hong, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 622 days.

(21) Appl. No.: 11/348,485

(22) Filed: Feb. 7, 2006

(65) Prior Publication Data

US 2006/0175644 A1    Aug. 10, 2006

(30) Foreign Application Priority Data

Feb. 7, 2005    (KR)  ............... 10-2005-0011410

(51) Int. Cl.
*G11B 5/64*    (2006.01)
(52) U.S. Cl. .................. 428/826; 257/295; 257/288
(58) Field of Classification Search .............. None
See application file for complete search history.

(56) References Cited

U.S. PATENT DOCUMENTS

| | | | | |
|---|---|---|---|---|
| 5,555,219 A | * | 9/1996 | Akiyama et al. | ............ 349/182 |
| 5,610,853 A | * | 3/1997 | Akiyama et al. | ............ 365/145 |
| 5,768,185 A | * | 6/1998 | Nakamura et al. | ..... 365/185.01 |
| 6,128,212 A | * | 10/2000 | Nakamura et al. | .......... 365/145 |
| 6,387,712 B1 | * | 5/2002 | Yano et al. | ..................... 438/3 |
| 2004/0047173 A1 | | 3/2004 | Kang | |
| 2004/0065912 A1 | | 4/2004 | Liu et al. | |
| 2004/0105380 A1 | * | 6/2004 | Cho et al. | ................... 369/126 |
| 2006/0109704 A1 | | 5/2006 | Seo et al. | |

FOREIGN PATENT DOCUMENTS

| | | | |
|---|---|---|---|
| EP | 0851417 A1 | | 7/1998 |
| FR | 2786005 A1 | | 11/1998 |
| JP | 9-134552 A | | 5/1997 |
| JP | 2002175602 A | * | 6/2002 |

* cited by examiner

*Primary Examiner*—Mark Ruthkosky
*Assistant Examiner*—Gary D Harris
(74) *Attorney, Agent, or Firm*—Sughrue Mion, PLLC

(57) ABSTRACT

A ferroelectric recording medium and a writing method for the same are provided. The ferroelectric recording medium includes a ferroelectric layer which reverses its polarization when receiving a predetermined coercive voltage. A nonvolatile anisotrophic conduction layer is formed on the ferroelectric layer. A resistance of the anisotrophic conduction layer decreases when receiving a first voltage lower than the coercive voltage, and the resistance of the anisotrophic conduction layer increases when receiving a second voltage higher than the coercive voltage. Multi-bit information is stored by a combination of polarization states of the ferroelectric layer and the resistance of the anisotrophic conduction layer. Accordingly, multiple bits can be expressed on one domain of the ferroelectric recording medium.

6 Claims, 5 Drawing Sheets

FERROELECTRIC RECORDING MEDIUM AND WRITING METHOD FOR THE SAME

CROSS-REFERENCE TO RELATED PATENT APPLICATIONS

This application claims priority from Korean Patent Application No. 10-2005-0011410, filed on Feb. 7, 2005, in the Korean Intellectual Property Office, the disclosure of which is incorporated herein in its entirety by reference.

BACKGROUND OF THE INVENTION

1. Field of the Invention

Apparatuses and methods consistent with the present invention relate to a ferroelectric recording medium, and more particularly, to a multi-bit ferroelectric recording medium and a writing method for the same.

2. Description of the Related Art

Ferroelectric material has spontaneous polarization that can be reversed by an electric field. A ferroelectric recording medium is a high-capacity nonvolatile recording medium on which data can be written, modified, and stored using physical characteristics of the ferroelectric material.

A related art ferroelectric recording medium will be described with reference to FIGS. 1 and 2.

FIG. 1 is a perspective view of a related art ferroelectric recording medium, and FIG. 2 is a perspective view of another related art ferroelectric recording medium.

Referring to FIGS. 1 and 2, related art ferroelectric recording mediums include a ferroelectric recording layer 2 (12). Using a read/write head 1 (11), data are read from or written to the ferroelectric recording layer 2 (22). The ferroelectric recording mediums may further include a separate protective film 13 (FIG. 2) so as to protect the read/write head 1 (11) and the ferroelectric recording layer 2 (22) from being damaged by a direct contact therebetween.

The ferroelectric recording layer 2 (22) is partitioned into a plurality of domains 3 (14). Data is recorded in each of the domains 3 (14) and read therefrom whenever necessary. A reading/writing method for a related art ferroelectric recording medium will now be described with reference to FIG. 3.

Referring to FIG. 3, a related art ferroelectric recording medium includes a ferroelectric recording layer 22 partitioned into a plurality of domains 24, 25, 26 and 27, and a protective film 23 for protecting the ferroelectric recording layer 22.

When a predetermined voltage is applied to a specific region of the ferroelectric recording medium through a read/write head, a polarization reversal occurs in a corresponding domain and then the domain is switched back to the original polarization by another voltage.

Thus, an upper polarization and a lower polarization occur in each domain 24, 25, 26 and 27 of the ferroelectric recording layer. States of the domains 24, 25, 26 and 27 are defined by the upper polarization and the lower polarization.

When the read/write head is positioned above a specific domain in which information is recorded, an induced current corresponding to the polarization of the domain is generated from the read/write head. Reference symbols V1 and V2 represent polarization amounts, and reference symbols I1 and I2 represent induced currents respectively corresponding to the polarization amounts (V1≠V2).

The related art ferroelectric recording medium can have only two states. That is, the upper polarization and the lower polarization in each domain and can store only one bit in each domain. Accordingly, there is a demand for improving the ferroelectric recording medium so that the ferroelectric recording medium can have more states and more bits can be recorded in each domain.

SUMMARY OF THE INVENTION

The present invention provides a multi-bit ferroelectric recording medium and a writing method for the same.

According to an aspect of the present invention, there is provided a ferroelectric recording medium including: a ferroelectric layer which reverses its polarization when receiving a predetermined coercive voltage; and a nonvolatile anisotrophic conduction layer formed on the ferroelectric layer, wherein a resistance of the anisotrophic conduction layer decreases when receiving at a first voltage lower than the coercive voltage, and the resistance of the anisotrophic conduction layer increases when receiving a second voltage higher than the coercive voltage, wherein multi-bit information is stored by a combination of polarization states of the ferroelectric layer and the resistance of the anisotrophic conduction layer.

The multi-bit information may be stored by a combination of upward and downward polarizations of the ferroelectric layer and high and low resistances of the anisotrophic conduction layer.

A first state may be expressed by the downward polarization of the ferroelectric layer and the low resistance of the anisotrophic conduction layer, and a second state may be expressed by the downward polarization of the ferroelectric layer and the high resistance of the anisotrophic conduction layer. A third state may be expressed by the upward polarization of the ferroelectric layer and the low resistance of the anisotrophic conduction layer, and a fourth state may be expressed by the upward polarization of the ferroelectric layer and the high resistance of the anisotrophic conduction layer.

According to another aspect of the present invention, there is provided a writing method for a ferroelectric recording medium, the writing method including: applying one of a first voltage, a coercive voltage and a second voltage to a ferroelectric recording medium to change a polarization state of a ferroelectric layer and a resistance of the anisotrophic conduction layer of the ferroelectric recording medium, thereby writing multi-bit information on the ferroelectric recording medium.

A first state may be expressed by applying the coercive voltage to the ferroelectric recording medium such that the ferroelectric layer has a downward polarization and the anisotrophic conduction layer has a low resistance.

Before expressing the first state, the first voltage may be applied to the ferroelectric recording medium such that the resistance of the anisotrophic conduction layer decreases.

A second state may be expressed by applying the second voltage to the ferroelectric recording medium such that the ferroelectric layer has a downward polarization and the anisotrophic conduction layer has a high resistance.

A third state may be expressed by applying a negative voltage, a magnitude of which is equal to that of the coercive voltage, to the ferroelectric recording medium such that the ferroelectric layer has an upward polarization and the anisotrophic conduction layer has a low resistance.

Before expressing the third state, a negative voltage of which magnitude is equal to that of the first voltage may be applied to the ferroelectric recording medium such that resistance of the anisotrophic conduction layer decreases.

A fourth state may be expressed by applying a negative voltage, a magnitude of which is equal to that of the second voltage, to the ferroelectric recording medium such that the ferroelectric layer has an upward polarization and the anisotrophic conduction layer has a high resistance.

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF EXEMPLARY EMBODIMENTS OF THE INVENTION

The present invention will now be described more fully with reference to the accompanying drawings, in which exemplary embodiments of the invention are shown.

Although an applied voltage is illustrated in a step form, this is merely an example and the voltage may, for example, have a continuous form.

Also, for the convenience of explanation, each domain of a ferroelectric layer and each of an anisotrophic conduction layer are separately partitioned. It is noted that each state of the domains can be implemented on one domain.

Figure 1:
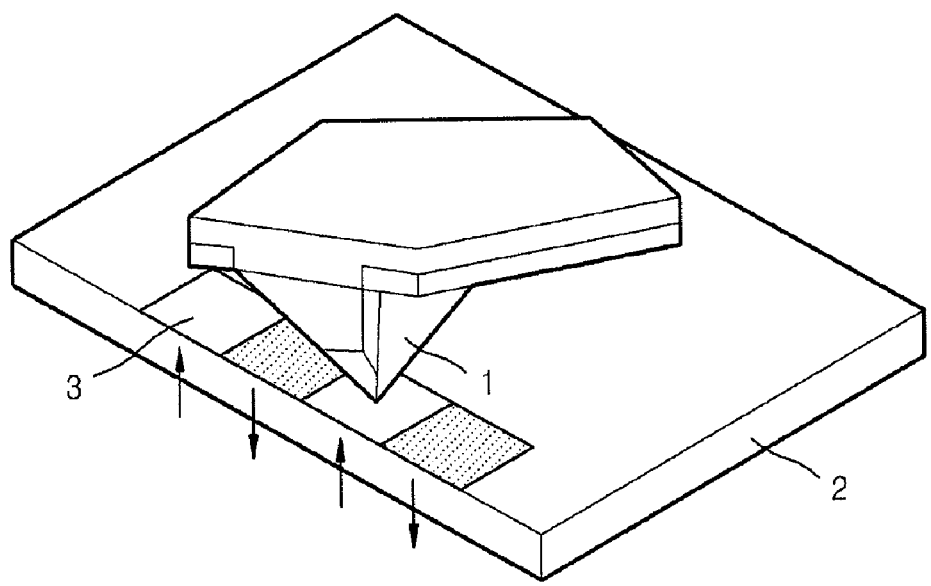
FIG. 1 is a perspective view of a related art ferroelectric recording medium.
Figure 2:
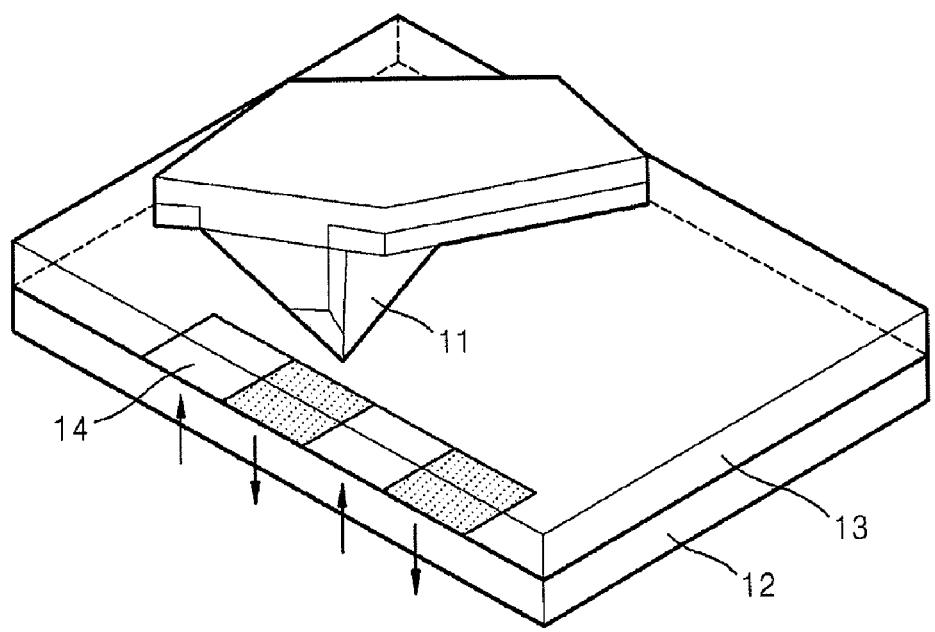
FIG. 2 is a perspective view of another related art ferroelectric recording medium.
Figure 3:
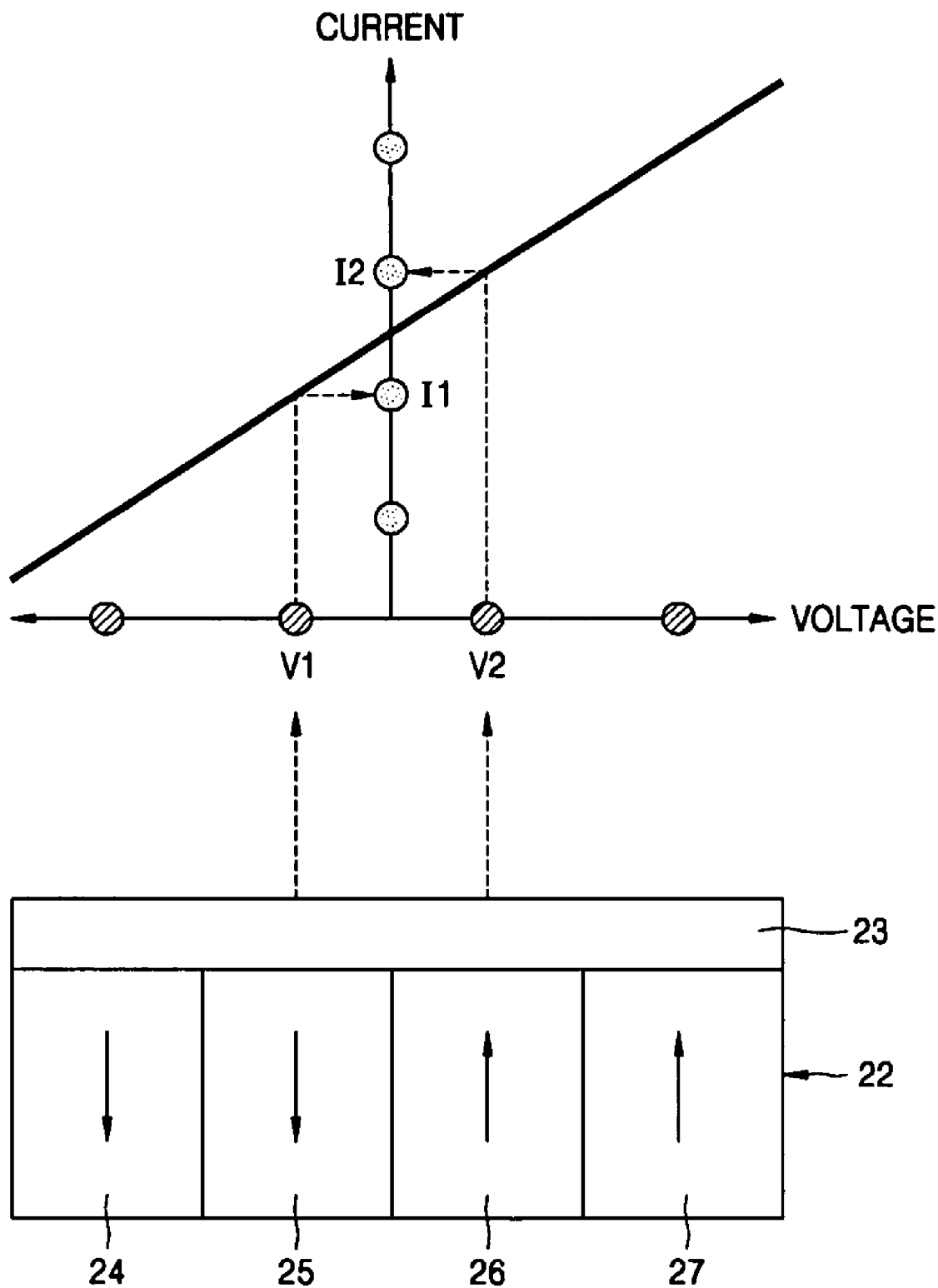
FIG. 3 is a view illustrating a reading/writing method for a related art ferroelectric recording medium.
Figure 4:
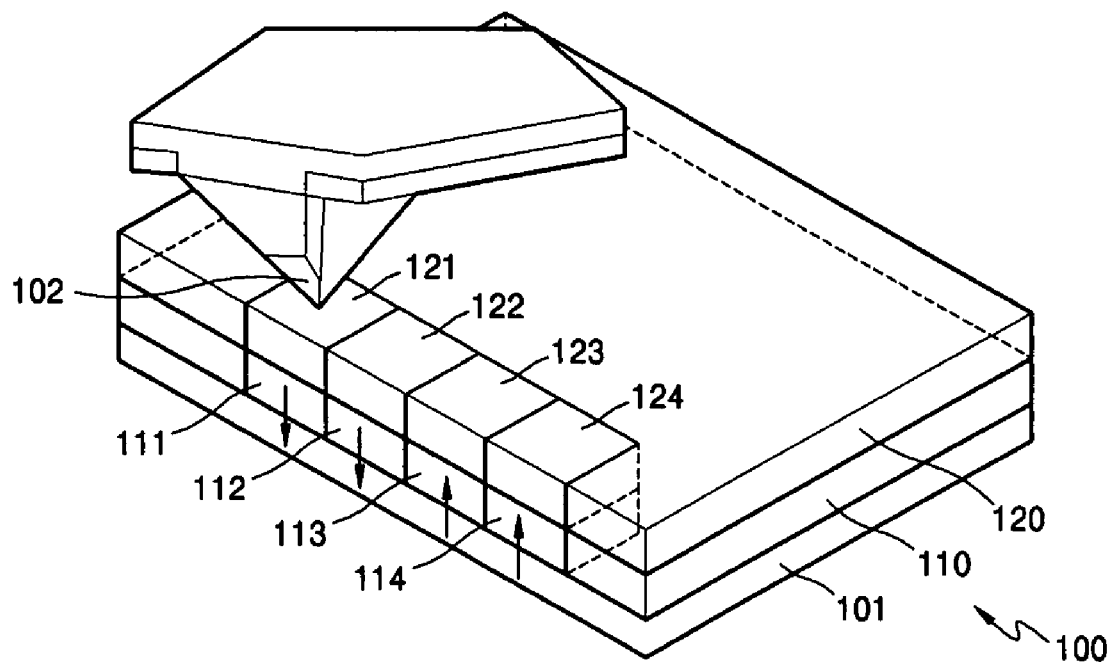
FIG. 4 is a perspective view of a ferroelectric recording medium according to an exemplary embodiment of the present invention.

FIG. 4 is a perspective view of a ferroelectric recording medium according to an exemplary embodiment of the present invention.

Referring to FIG. 4, the ferroelectric recording medium 100 includes an electrode 101, a ferroelectric recording layer 110 formed on the electrode 101, and an anisotrophic conduction layer 120 covering the ferroelectric recording medium 110. Reference numerals 111, 112, 113 and 114 represent domains of the ferroelectric recording layer 110, and reference numerals 121, 122, 123 and 124 represent domains of the anisotrophic conduction layer 120, which correspond to the domains 111, 112, 113 and 114.

The ferroelectric recording layer 110 performs a read/write operation in association with a read/write head 102. Each of the domains 111, 112, 113 and 114 can store information independently in association with the read/write head 102. Different data can be recorded on the ferroelectric recording layer 110 depending on an applied voltage and its polarization. This feature will be described in detail later.

The anisotrophic conduction layer 120 covers the ferroelectric recording layer 110 such that the read/write head 102 does not directly come in contact with the ferroelectric recording layer 110. Since the anisotrophic conduction layer 120 protects the ferroelectric recording layer 110 from being scratched, damage of data can be prevented. Also, since the anisotrophic conduction layer 120 protects the read/write head from being damaged or broken, degradation of read/write performance can be prevented.

Since the anisotrophic conduction layer 120 becomes conductive at more than a threshold voltage, it can serve as an electrode. Therefore, even when a low voltage is applied to the read/write head 102 and the ferroelectric recording layer 110, spontaneous polarization of the ferroelectric recording layer 110 can be reversed. Consequently, information can be recorded on the ferroelectric recording layer 110 even when a low voltage is applied thereto.

Also, the anisotrophic conduction layer 120 can store information in association with the ferroelectric recording layer 110. This will be described later.

Figure 5:
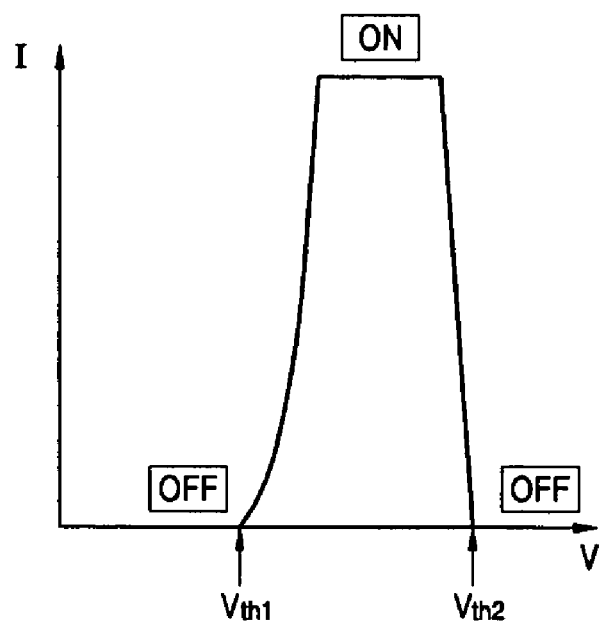
FIG. 5 is a graph illustrating transition of a nonvolatile anisotrophic conduction layer in the ferroelectric recording medium according to an exemplary embodiment of the present invention.

FIG. 5 is a graph illustrating a transition of the nonvolatile anisotrophic conduction layer 120 in the ferroelectric recording medium 100 according to an exemplary embodiment of the present invention.

Referring to FIG. 5, the anisotrophic conduction layer 120 of the ferroelectric recording medium 100 has a nonvolatile property and its electric resistance varies with a voltage applied between the read/write head 102 and the electrode 101. For the sake of convenience, Vth1 and Vth2 are defined as a first voltage and a second voltage, respectively.

The anisotrophic conduction layer 120 is in a nonconductive state until the applied voltage reaches the first voltage of Vth1. When the applied voltage is greater than or equal to the first voltage of Vth1, the electric resistance of the anisotrophic conduction layer 120 decreases so that the anisotrophic conduction layer 120 becomes conductive. In this state, the anisotrophic conduction layer 120 maintains its conductivity even when the applied voltage is removed. Meanwhile, when the applied voltage is greater than or equal to the second voltage of Vth2, the electric resistance of the anisotrophic conduction layer 120 increases so that the anisotrophic conduction layer 120 becomes nonconductive.

Figure 6:
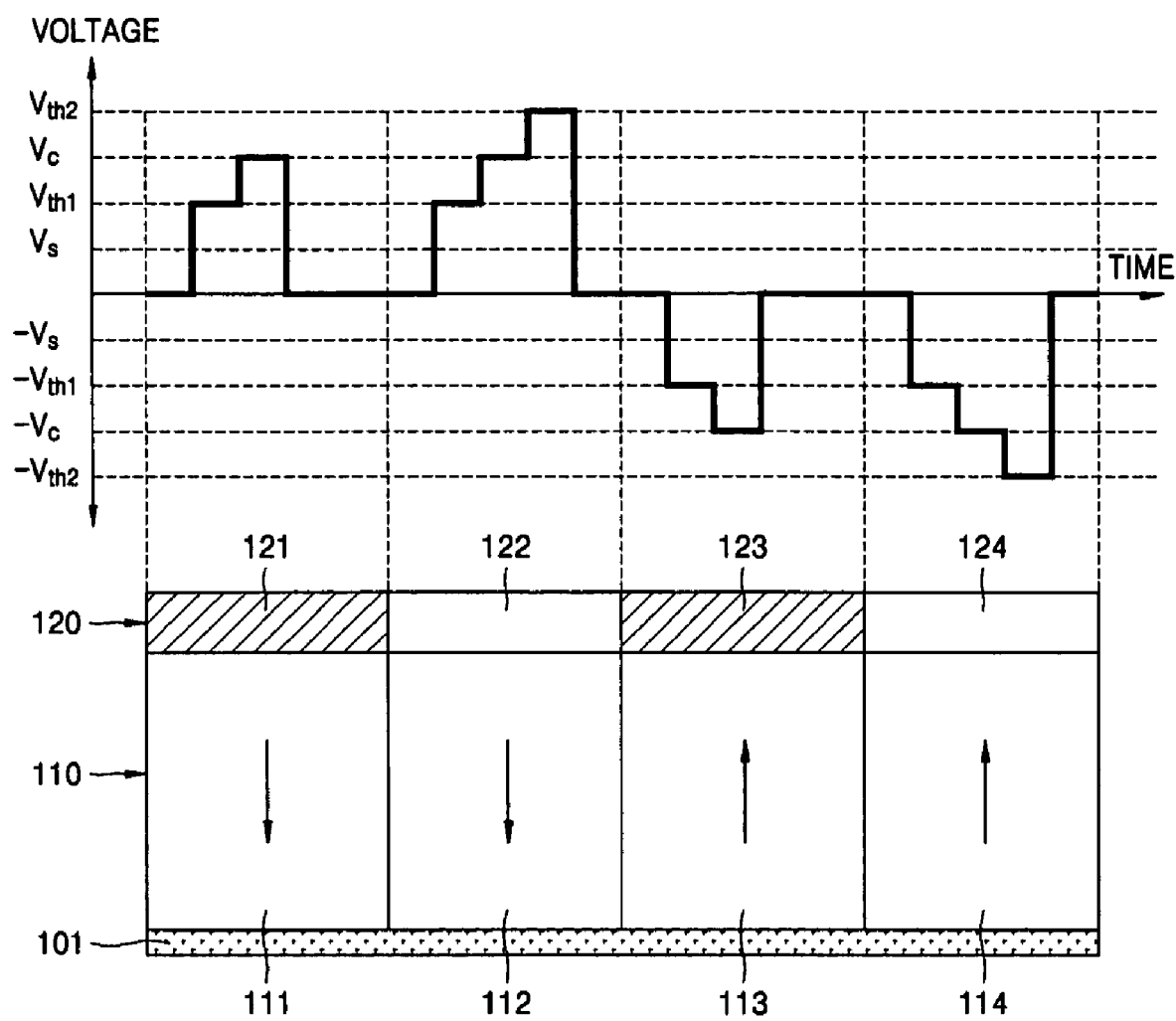
FIG. 6 is a view illustrating a writing method for the ferroelectric recording medium according to an exemplary embodiment of the present invention.

FIG. 6 is a view illustrating a writing method for the ferroelectric recording medium according to an exemplary embodiment of the present invention.

Referring to FIG. 6, a polarization of the ferroelectric recording layer 110 and/or a resistance of the anisotrophic conduction layer 120 are changed by applying one of the first voltage, a coercive voltage and the second voltage to the ferroelectric recording medium 100. In this case, one domain can express four states and store two bits.

According to the present invention, four states can be expressed on one domain, but this is merely an example for an exemplary embodiment of the invention. That is, the number of expressible states can increase by further providing another ferroelectric layer, another anisotrophic conduction layer, and/or separate layers on one domain. Therefore, the states corresponding to bits can be expressed by forming the ferroelectric layer, the anisotrophic conduction layer, and/or the separate layer in a predetermined layered structure.

Vc represents a voltage when the polarizations of the domains 111, 112, 113 and 114 of the ferroelectric layer 110 are reversed by the externally applied voltage. The voltage Vc is defined as the coercive voltage. Vth1 is a voltage when the electric resistance of the domains 121, 122, 123 and 124 of the anisotrophic conduction layer 120 decreases. The voltage Vth1 is defined as the first voltage. Vth2 is a voltage when the electric resistance of the domains 121, 122, 123 and 124 increases. The voltage Vth2 is defined as the second voltage. Also, Vs is a surface potential of each layer.

In this exemplary embodiment, a relationship among these voltages is Vs<Vth1<Vc<Vth2.

It may be preferable to form a plurality of domains 111, 112, 113 and 114 of the ferroelectric layer 110 and a plurality of domains 121, 122, 123 and 124 of the anisotrophic conduction layer 120. Also, may be preferable that the domains 111, 112, 113 and 114 of the ferroelectric layer 110 and the domains 121, 122, 123 and 124 of the anisotrophic conduction layer 120 are arranged corresponding to one another.

As illustrated in FIG. 6, the domain 111 of the ferroelectric layer 110 and the domain 121 of the anisotrophic conduction layer 120 express a first state. The first state will now be described in detail.

An external positive voltage that is greater than or equal to the coercive voltage or less than the second voltage is applied to the domain 111 of the ferroelectric layer 110 and the domain 121 of the anisotrophic conduction layer 120. In this case, the domain 111 of the ferroelectric layer 110 has a downward polarization and the domain 121 of the anisotrophic conduction layer 120 has a low resistance, so that the domain 121 of the anisotrophic conduction layer 120 becomes conductive. In this state, since the electric resistance of the domain 121 of the anisotrophic conduction layer 120 is very slight, the states of the domains 121 and 111 are determined according to the downward polarization that exists in the domain 111 of the ferroelectric layer 110.

The state of the domains 111 and 121 is defined as the first state. The domains 111 and 121 of the first state can configure two bits. For example, "0" can be configured in the domain 111 of the ferroelectric layer 110 and in the domain 121 of the anisotrophic conduction layer 120, respectively.

Before expressing the first state, an external voltage that is greater than or equal to the first voltage or less than the coercive voltage is applied to the domain 111 of the ferroelectric layer 110 and the domain 121 of the anisotrophic conduction layer 120. In this case, the electric resistance of the domain 121 of the anisotrophic conduction layer 120 decreases so that information is easy to store in the domain 111 of the ferroelectric layer 110.

As illustrated in FIG. 6, the domain 112 of the ferroelectric layer 110 and the domain 122 of the anisotrophic conduction layer 120 express a second state. The second state will now be described in detail.

An external voltage that is equal to the second voltage or greater than the coercive voltage and the second voltage is applied to the domain 112 of the ferroelectric layer 110 and the domain 122 of the anisotrophic conduction layer 120. In this case, the domain 112 of the ferroelectric layer 110 has a downward polarization and the domain 122 of the anisotrophic conduction layer 120 has a high resistance, so that the domain 122 of the anisotrophic conduction layer 120 becomes nonconductive. In this state, since the electric resistance of the domain 122 of the anisotrophic conduction layer 120 is very large, the states of the domains 122 and 112 are determined according to the electric resistance and the downward polarization of the domain 112 of the ferroelectric layer 110.

The state of the domains 112 and 122 is defined as the second state. The domains 112 and 122 of the second state can configure two bits. For example, "0" can be configured in the domain 112 of the ferroelectric layer 110 and "1" can be configured in the domain 122 of the anisotrophic conduction layer 120, respectively.

As illustrated in FIG. 6, the domain 113 of the ferroelectric layer 110 and the domain 123 of the anisotrophic conduction layer 120 express a third state. The third state will now be described in detail.

An external negative voltage of which magnitude is greater than or equal to the coercive voltage or less than the second voltage is applied to the domain 113 of the ferroelectric layer 110 and the domain 123 of the anisotrophic conduction layer 120. In this case, the domain 113 of the ferroelectric layer 110 has an upward polarization and the domain 123 of the anisotrophic conduction layer 120 has a low resistance, so that the domain 123 of the anisotrophic conduction layer 120 becomes conductive. In that state, since the electric resistance of the domain 123 of the anisotrophic conduction layer 120 is very slight, the states of the domains 123 and 113 are determined according to the upward polarization that exists in the domain 113 of the ferroelectric layer 110.

The state of the domains 113 and 123 is defined as the third state. The domains 113 and 123 of the third state can configure two bits. For example, "1" can be configured in the domain 113 of the ferroelectric layer 110 and "0" can be configured in the domain 123 of the anisotrophic conduction layer 120, respectively.

Before expressing the third state, an external negative voltage of which magnitude is greater than or equal to the first voltage or less than the coercive voltage is applied to the domain 113 of the ferroelectric layer 110 and the domain 123 of the anisotrophic conduction layer 120. In this case, since the electric resistance of the domain 123 of the anisotrophic conduction layer 120 decreases so that information is easy to store in the domain 113 of the ferroelectric layer 110.

As illustrated in FIG. 6, the domain 114 of the ferroelectric layer 110 and the domain 124 of the anisotrophic conduction layer 120 express a fourth state. The fourth state will now be described in detail.

An external negative voltage of which magnitude is equal to the second voltage or greater than the coercive voltage and the second voltage is applied to the domain 114 of the ferroelectric layer 110 and the domain 124 of the anisotrophic conduction layer 120. In this case, the domain 114 of the ferroelectric layer 110 has an upward polarization and the domain 124 of the anisotrophic conduction layer 120 has a high resistance, so that the domain 124 of the anisotrophic conduction layer 120 becomes nonconductive. In that state, since the electric resistance of the domain 124 of the anisotrophic conduction layer 120 is large, the states of the domains 124 and 114 are determined according to the electric resistance and the upward polarization of the domain 114 of the ferroelectric layer 110.

The state of the domains 114 and 124 is defined as the fourth state. The domains 114 and 124 of the fourth state can configure two bits. For example, "1" can be configured in the domain 114 of the ferroelectric layer 110 and the domain 124 of the anisotrophic conduction layer 120, respectively.

As described above, four states can be expressed on one domain pair of the ferroelectric layer 110 and the anisotrophic conduction layer 120. Two bits can be configured on one domain pair.

Figure 7:
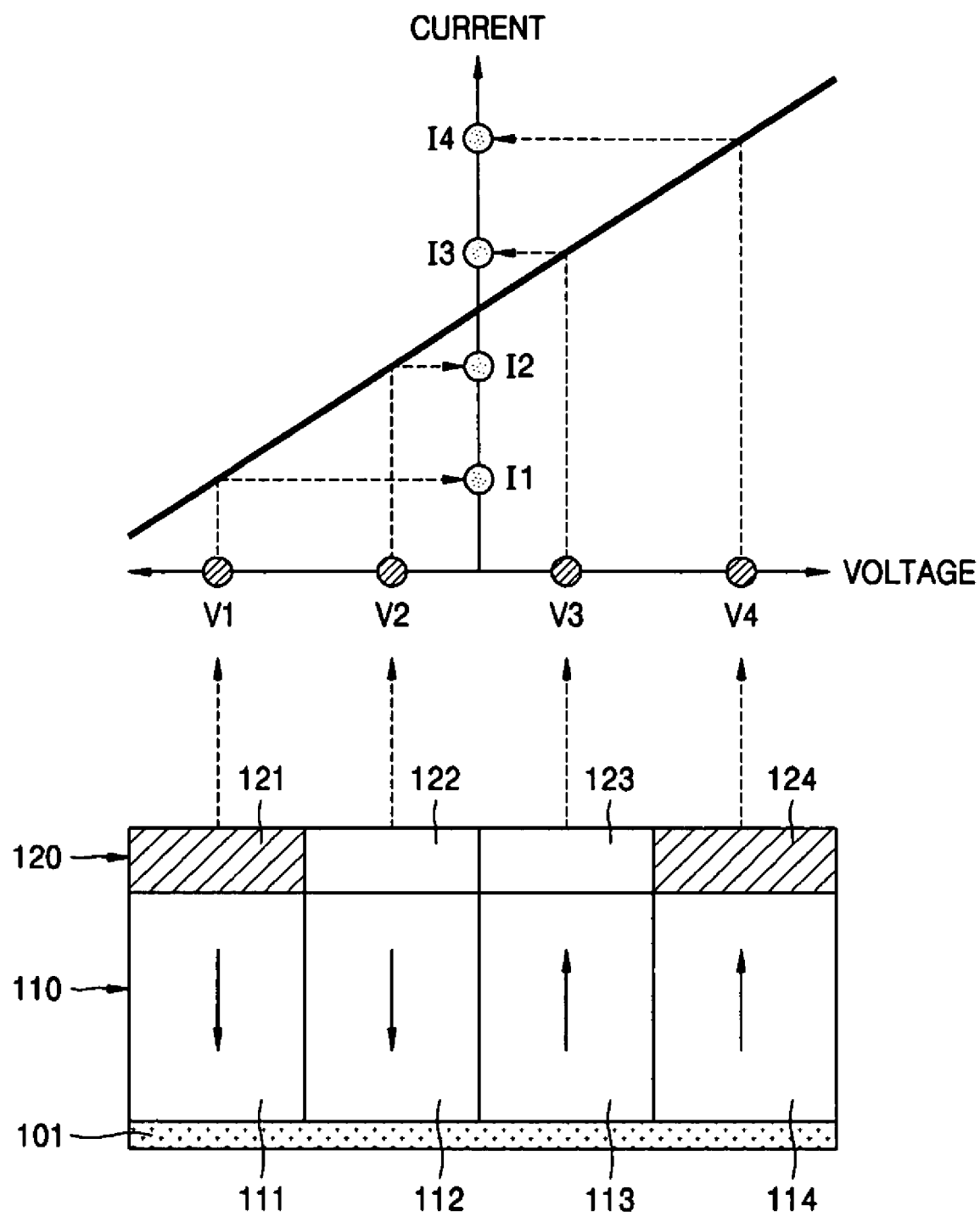
FIG. 7 is a view illustrating a reading method for the ferroelectric recording medium according to an exemplary embodiment of the invention.

FIG. 7 is a view illustrating a reading method of the ferroelectric recording medium according to an exemplary embodiment of the present invention.

Referring to FIG. 7, different information is stored in the domains 111, 112, 113 and 114 of the ferroelectric layer 110 and the domains 121, 122, 123 and 124 of the anisotrophic conduction layer 120 according to the magnitude of the applied external voltage. Corresponding information is read through the read/write head 102 according to the polarization of the domains 111, 112, 113 and 114 and the electric resistance of the domains 121, 122, 123 and 124.

Voltages V1, V2, V3 and V4 are applied to the read/write head 102 in the domains 111, 112, 113 and 114 and the corresponding domains 121, 122, 123 and 124. Induced currents I1, I2, I3 and I4, which correspond to the voltages V1, V2, V3 and V3, respectively, are generated in the read/write head 102.

In FIG. 7, the first state is expressed on the domain 111 of the ferroelectric layer 110 and the domain 121 of the anisotrophic conduction layer 120. The second state is expressed on the domain 112 of the ferroelectric layer 110 and the domain 122 of the anisotrophic conduction layer 120. The third state is expressed on the domain 113 of the ferroelectric layer 110 and the domain 123 of the anisotrophic conduction layer 120. Likewise, the fourth state is expressed on the domain 114 of the ferroelectric layer 110 and the domain 124 of the anisotrophic conduction layer 120.

The first state through the fourth state apply the voltages V1, V2, V3 and V4 to the read/write head 102 according to the upward or downward polarization existing on the domains of the ferroelectric layer 110 and the electric resistance of the domains of the anisotrophic conduction layer 120. In that case, the induced currents I1, I2, I3 and I4 corresponding to the voltages V1, V2, V3 and V4 are generated from the read/write head 102.

According to the exemplary embodiment, the induced currents can have four values and the information corresponding to the respective induced currents can be read.

In the writing operation, information corresponding to the induced current I1 is stored in the domain pair 111 and 121 when the external positive voltage that is greater than or equal to the coercive voltage or less than the second voltage is applied to the domain 111 of the ferroelectric layer 110 and the domain 121 of the anisotrophic conductive layer 120. The information may be, for example, 00.

Information corresponding to the induced current I2 is stored in the domain pair 112 and 122 when the external positive voltage that is equal to the second voltage or greater than the coercive voltage and the second voltage is applied to the domain 112 of the ferroelectric layer 110 and the domain 122 of the anisotrophic conductive layer 120. The information may be, for example, 01.

Information corresponding to the induced current I3 is stored in the domain pair 113 and 123 when the external negative voltage of which magnitude is greater than or equal to the coercive voltage or less than the second voltage is applied to the domain 113 of the ferroelectric layer 110 and the domain 123 of the anisotrophic conductive layer 120. The information may be, for example, 10.

Information corresponding to the induced current I4 is stored in the domain pair 114 and 124 when the external negative voltage of which magnitude is equal to the second voltage or greater than the coercive voltage and the second voltage is applied to the domain 114 of the ferroelectric layer 110 and the domain 124 of the anisotrophic conductive layer 120. The information may be, for example, 11.

As described above, four states can be expressed on one domain pair of the ferroelectric layer 110 and the anisotrophic conduction layer 120, and two bits configured on one domain pair can be reproduced.

According to the present invention, four or more states can be expressed on one domain pair of the ferroelectric layer and the corresponding anisotrophic conduction layer, and two or more bits can be configured on one domain pair.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A ferroelectric recording medium comprising:
a ferroelectric layer which reverses its polarization when receiving a coercive voltage; and
a nonvolatile anisotrophic conduction layer having increased electrical conductivity in a vertical direction and disposed on the ferroelectric layer,
wherein the electrical resistance of the anisotrophic conduction layer decreases when receiving a first voltage lower than the coercive voltage, and the electrical resistance of the anisotrophic conduction layer increases when receiving a second voltage higher than the coercive voltage, and
wherein multi-bit information is stored by a combination of upward and downward polarizations of the ferroelectric layer and high and low electrical resistances of the anisotrophic conduction layer.

2. The ferroelectric recording medium of claim 1, wherein a first state is expressed by the downward polarization of the ferroelectric layer and the low resistance of the anisotrophic conduction layer;
a second state is expressed by the downward polarization of the ferroelectric layer and the high resistance of the anisotrophic conduction layer;
a third state is expressed by the upward polarization of the ferroelectric layer and the low resistance of the anisotrophic conduction layer; and
a fourth state is expressed by the upward polarization of the ferroelectric layer and the high resistance of the anisotrophic conduction layer.

3. The ferroelectric recording medium of claim 1, wherein:
the ferroelectric layer is partitioned into a plurality of domains for recording bit information;
the nonvolatile anisotrophic conduction layer is partitioned into a plurality of domains for recording bit information; and
each of the domains of the ferroelectric layer corresponds to one of the domains of the anisotrophic conduction layer.

4. A ferroelectric recording medium comprising:
a ferroelectric layer which reverses its polarization when receiving a coercive voltage; and
a nonvolatile anisotrophic conduction layer which is disposed on the ferroelectric layer,
wherein the anisotrophic conduction layer is configured to exhibit higher resistance and a nonconductive state, if a received voltage is lower than a first voltage,
wherein the anisotrophic conduction layer is configured to exhibit a lower resistance and a conductive state, if the received voltage is greater than or equal to the first voltage, but less than a second voltage,
wherein the anisotrophic conduction layer is configured to exhibit higher resistance and a nonconductive state if the received voltage is greater than or equal to the second voltage,
wherein the first voltage is less than the second voltage,
wherein the first voltage is less than the coercive voltage,
wherein the coercive voltage is less than the second voltage, and
wherein multi-bit information is stored by a combination of upward and downward polarizations of the ferroelectric layer and higher and lower electrical resistances of the anisotrophic conduction layer.

5. The ferroelectric recording medium of claim 1, wherein the nonvolatile anisotrophic conduction layer has exhibits increased electrical conductivity in the vertical direction relative to electrical conductivity in a horizontal direction.

6. The ferroelectric recording medium of claim 5, wherein the nonvolatile anisotrophic conduction layer exhibits electrical conductivity in the vertical direction but exhibits no electrical conductivity in the horizontal direction.

* * * * *